(12) United States Patent
Li et al.

(10) Patent No.: US 11,536,589 B2
(45) Date of Patent: Dec. 27, 2022

(54) ELECTROMAGNETIC NOISE POSITION SENSING

(71) Applicants: Toyota Motor Engineering & Manufacturing North America, Inc., Plano, TX (US); Toyota Jidosha Kabushiki Kaisha, Aichi-ken (JP)

(72) Inventors: Xiaopeng Li, Ann Arbor, MI (US); Taehwa Lee, Ann Arbor, MI (US); Kenichi Yatsugi, Nagakute (JP); Michio Yasunishi, Nagoya (JP); Hiroshi Yoshimoto, Toyota (JP); Takumi J. Jinmon, Ann Arbor, MI (US); Hideo Iizuka, Aichi (JP)

(73) Assignees: Toyota Motor Engineering & Manufacturing North America, Inc., Plano, TX (US); Toyota Jidosha Kabushiki Kaisha, Aichi-ken (JP)

( * ) Notice: Subject to any disclaimer, the term of this patent is extended or adjusted under 35 U.S.C. 154(b) by 116 days.

(21) Appl. No.: 17/196,054

(22) Filed: Mar. 9, 2021

(65) Prior Publication Data

US 2022/0291023 A1 Sep. 15, 2022

(51) Int. Cl.
*G01R 33/02* (2006.01)
*G01D 5/22* (2006.01)
*G01R 33/00* (2006.01)

(52) U.S. Cl.
CPC ....... *G01D 5/2275* (2013.01); *G01R 33/0041* (2013.01); *G01R 33/0213* (2013.01)

(58) Field of Classification Search
CPC ............... G01R 33/00; G01R 33/0035; G01R 33/0023; G01R 33/0017; G01R 31/3191;
(Continued)

(56) References Cited

U.S. PATENT DOCUMENTS

| 3,634,843 A | 1/1972 | Corris | |
| 4,591,710 A * | 5/1986 | Komadina | G06F 3/0421 |
| | | | 250/221 |

(Continued)

FOREIGN PATENT DOCUMENTS

| EP | 2975422 A1 | 1/2016 |
| JP | 2006113628 A | 4/2006 |

OTHER PUBLICATIONS

K. Sasaki, S. Sugiura, and H. Iizuka, "Distance adaption method for magnetic resonance coupling between varactor-loaded parallel-wire coils," IEEE Trans. Microwave Theory Techniques, vol. 62, No. 4, pp. 892-900, Apr. 2014.

(Continued)

*Primary Examiner* — Jermele M Hollington
*Assistant Examiner* — Taqi R Nasir
(74) *Attorney, Agent, or Firm* — Christopher G. Darrow; Darrow Mustafa PC

(57) ABSTRACT

Embodiments described herein relate to a device for detecting the position of electromagnetic noise. The device includes a detector that includes coils that produce voltages in the presence of electromagnetic noise of a defined frequency. The device further includes a controller that senses the voltages and determines a position of the electromagnetic noise relative to the device according to the voltages.

20 Claims, 11 Drawing Sheets

(58) Field of Classification Search
CPC .......... G01R 33/0041; G01R 33/0213; G01B 7/004; G01C 17/38; G06F 3/017; G06F 3/0346; G06F 3/012; G01D 5/2275
See application file for complete search history.

(56) References Cited

U.S. PATENT DOCUMENTS

| | | |
|---|---|---|
| 8,423,122 B2 | 4/2013 | Steinberg et al. |
| 9,239,314 B2 | 1/2016 | Hattersley et al. |
| 9,389,282 B2 | 7/2016 | Mizuma et al. |
| 10,072,947 B1 | 9/2018 | Mantler |
| 10,415,952 B2 | 9/2019 | Reddy et al. |
| 10,508,932 B2 | 12/2019 | Filatov |
| 2004/0021463 A1* | 2/2004 | Miyazawa ............... H01Q 7/00 324/539 |
| 2004/0046558 A1 | 3/2004 | Matsumoto |
| 2010/0275934 A1 | 11/2010 | Keren |
| 2013/0120057 A1* | 5/2013 | Vrazic ................... H04B 1/123 327/551 |

OTHER PUBLICATIONS

Lee, et al., "Fano resonance among magnetic coils for midrange position sensing capability," in IEEE Access, vol. 9, pp. 15623-15632, 2021, doi: 10.1109/ACCESS.2021.3052689.
U.S. Appl. No. 16/749,287, filed Jan. 22, 2020, entitled "System and Method for Determining at Least One Characteristic of a Transmitting Coil".

* cited by examiner

ELECTROMAGNETIC NOISE POSITION SENSING

TECHNICAL FIELD

The subject matter described herein relates in general to detecting electromagnetic noise, and, more particularly, to sensing a location of the electromagnetic noise using a detector that includes a plurality of position sensing coils.

BACKGROUND

Electromagnetic noise can emanate from different electronic devices and, at times, cause interference with other electronic devices. For example, various components of an electric or hybrid vehicle, such as electric motors, charge controllers, power converters, inverters, electrical connections, sensors, and so on, can all be associated with electromagnetic noise. In order to reduce opportunities for interference, the development of electronic devices, such as electric vehicles, may attempt to identify and remedy these sources of noise. However, within the context of a complex electronic device, identifying the location of electromagnetic noise can prove to be a complex problem. That is, a precise location of electromagnetic noise can be difficult to isolate since the noise can be spurious, embedded within various difficult to observe locations, and so on. As such, various approaches to remedying electromagnetic noise are time-consuming and costly.

SUMMARY

An example of a device that detects the position of electromagnetic noise is presented herein. As previously noted, detecting electromagnetic noise can present several unique difficulties. That is, because of the unique nature of this type of noise, specifically locating a source can be especially complex. Therefore, in one embodiment, a device is disclosed that overcomes the noted difficulties and thereby improves the detecting and locating of electromagnetic noise.

In at least one approach, a device includes four coils of wire that are coupled through magnetic fields and that sense electromagnetic noise. The coils are configured and arranged in a particular manner such that voltages from the coils occurring when the coils encounter electromagnetic noise (i.e., electromagnetic radiation) correspond with a relative position of the noise. The voltages in the separate coils depend on the particular location of the noise relative to the coil and are previously associated with distance and direction. Accordingly, a controller that is part of the device senses the voltages and derives ratios of the voltages between the coils. The controller correlates the ratios with the predefined ratios associated with directions/distances in order to identify a position of the noise.

It should be appreciated that the noise is generally of a predefined frequency (e.g., 10 MHz) to which the coils are tuned. The tuning may be by way of implementation (i.e., in the physical characteristics of the coils) and/or by way of tuning imparted by a specific tuning circuit. For example, the device may further include a tuning circuit that includes variable capacitors associated with separate coils. The controller can adjust the variable capacitors such that the coils sense a different frequency than originally tuned to sense. Accordingly, in one arrangement, the controller may dynamically adjust the coils to sense a different frequency when, for example, the voltages initially do not indicate the presence of noise such that the voltage ratios do not satisfy a defined threshold. In yet a further approach, the device is configured with multiple different sets of coils that are separately tuned to different frequencies, and the controller can then switch between the sets to select a different frequency for monitoring. In this way, the device provides for improving the identification of electromagnetic noise both in relation to the mere presence of such noise and the determination of a precise location to thereby facilitate the development of complex electronic systems.

In one embodiment, a device is disclosed. The device includes a detector that includes coils that produce voltages in the presence of electromagnetic noise of a defined frequency. The device further includes a controller that senses the voltages and determines a position of the electromagnetic noise relative to the device according to the voltages.

In one embodiment, an apparatus is disclosed. The apparatus includes a detector that includes at least four coils arranged into two pairs, the coils produce voltages in the presence of electromagnetic noise of a defined frequency, the pairs having windings formed in opposing directions. The apparatus includes a controller that senses the voltages and determines a position of the electromagnetic noise relative to the device according to a ratio of the voltages as defined by a lookup table, the position indicating a distance and direction from the detector.

In one embodiment, a method is diclosed. The method includes, in response to receiving a signal that is electromagnetic noise of a defined frequency, determining voltage ratios between coils in a detector by at least sensing voltages from the coils. The method includes determining a position of the electromagnetic noise relative to the coils and according to the voltage ratios as defined by a lookup table of positions corresponding with different ratios.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or multiple elements may be designed as one element. In some embodiments, an element shown as an internal component of another element may be implemented as an external component and vice versa. Furthermore, elements may not be drawn to scale.

DETAILED DESCRIPTION

Figure 1:
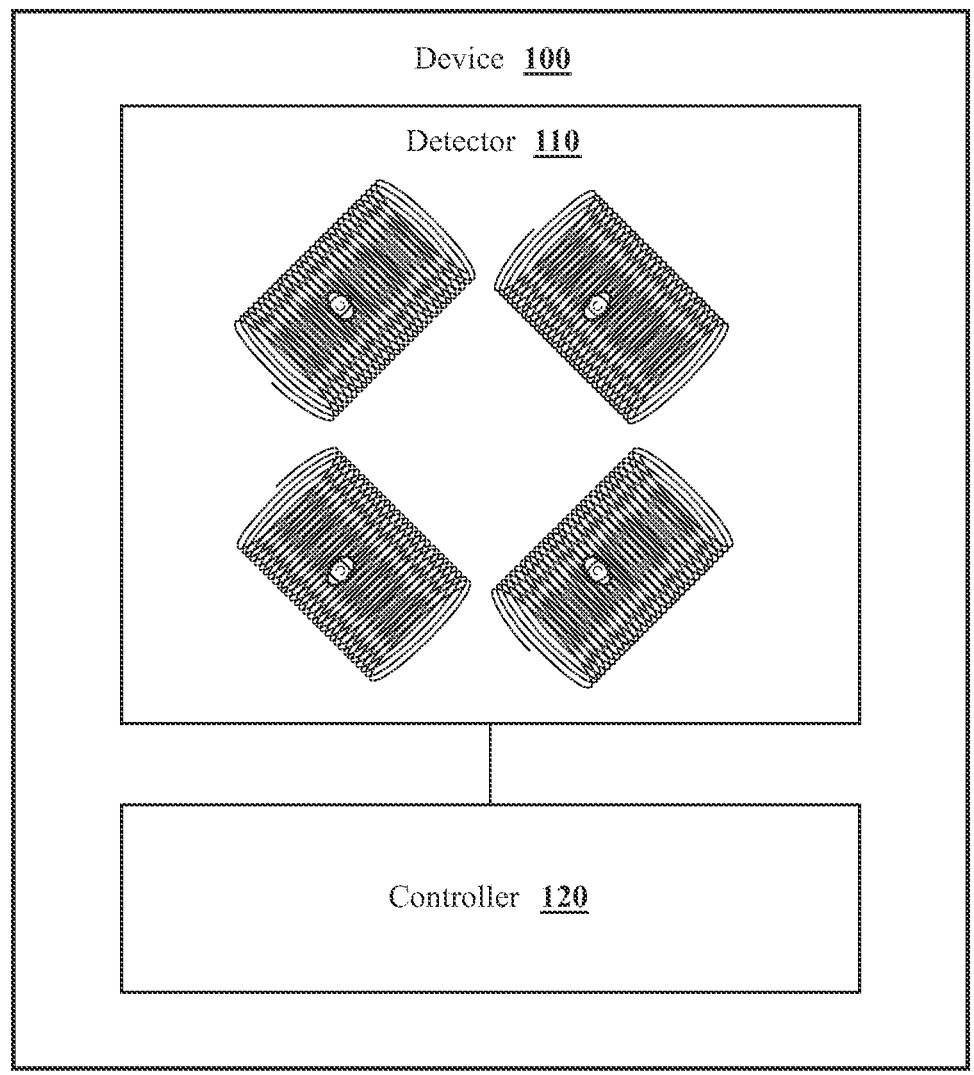
FIG. 1 is a block diagram illustrating one embodiment of a device associated with locating electromagnetic noise.

Systems, methods, and other embodiments associated with detecting the position of electromagnetic noise are presented herein. As previously noted, detecting electromagnetic noise can present several unique difficulties. That is, because of the unique nature of this type of noise, specifically locating a source can be especially complex. In various occurrences, the noise may derive from one of many different electronic components that are spaced closely within a vehicle or other complex electronic device. Therefore, in one embodiment, a device is disclosed that overcomes the noted difficulties by detecting and locating the electromagnetic noise to facilitate resolving these occurrences in an efficient manner.

In at least one approach, a device includes four coils that are coupled through magnetic fields. This coupling facilitates sensing electromagnetic noise. As a brief note, the electromagnetic noise is, in general, electromagnetic radiation, which may also be referred to as electromagnetic interference, and is generally a source of radiation that affects an electrical circuit in the form of causing errors, loss of data, or otherwise may interfere with the functioning of such a circuit. Moreover, the electromagnetic noise may be within a specific frequency spectrum, such as 10-15 MHz. Sources of the electromagnetic noise may include power converters and other electronic devices and can result from switching circuitry included therein.

In any case, the coils are configured and arranged in a particular manner such that voltages from the coils occurring when the coils encounter electromagnetic noise correspond with a relative position of the noise. The voltages in the separate coils depend on the relative location of the noise to the coil, which may be previously associated with distances and directions using a predefined lookup table. Accordingly, a controller that is part of the device senses the voltages and derives ratios of the voltages between the coils. The controller correlates the ratios with the predefined ratios associated with directions/distances in order to identify a position of the noise.

It should be appreciated that the noise is generally of a predefined frequency (e.g., 10 MHz) to which the coils are tuned. The tuning may be by way of implementation (i.e., in the physical characteristics of the coils) and/or imparted by a specific tuning circuit within a range of scannable frequencies. In one arrangement, the device may further include a tuning circuit that includes variable capacitors associated with separate coils. The controller can adjust the variable capacitors such that the coils sense a different frequency than originally tuned to sense (e.g., within a margin of 20% of the original defined frequency). Accordingly, in one arrangement, the controller may dynamically adjust the coils to sense a different frequency when, for example, the voltages initially do not indicate the presence of noise such that the voltage ratios do not satisfy a defined threshold.

In yet a further approach, the device is configured with multiple different sets of coils that are separately tuned to different frequencies. Accordingly, the controller can selectively switch between the sets of coils to select a different frequency for monitoring when, for example, noise is not detected on a particular frequency. In this way, the device provides for improving the identification of electromagnetic noise both in relation to the mere presence of such noise and the determination of a precise location to thereby facilitate the development of complex electronic systems.

Referring to FIG. 1, an example of a device 100 is illustrated. The disclosed device 100 is generally discussed as being implemented as a handheld device but may also be implemented as a tabletop device or as part of a larger object such as an infrastructure device. While arrangements may be described herein with respect to using the device 100 to detect noise in relation to electric automobiles, it will be understood that embodiments are not limited to sensing noise in relation to automobiles but may sense and locate electromagnetic noise for any type of electronic device that produces noise within a range that the device 100 may detect. Additionally, it should be noted that the device 100 is, in one embodiment, comprised of silicon-based components. That is, in one approach, one or more of the components embodied in the device 100 are in the form of a complementary metal-oxide-semiconductor (CMOS) compatible silicon-on-insulator-based chips that may also include electronic control circuitry.

The device 100 also includes various elements. It will be understood that, in various embodiments, it may not be necessary for the device 100 to have all of the elements shown in FIG. 1. The device 100 can have any combination of the various elements shown in FIG. 1. Further, the device 100 can have additional elements to those shown in FIG. 1. Further, while the various elements are shown as being located within the device 100 in FIG. 1, it will be understood that one or more of these elements can be located external to the device 100. Further, the elements shown may be physically separated by varying distances.

Additionally, it will be appreciated that for simplicity and clarity of illustration, where appropriate, reference numerals have been repeated among the different figures to indicate corresponding or analogous elements. The present discussion outlines numerous, specific details to provide a thorough understanding of the embodiments described herein. Those of skill in the art, however, will understand that the embodiments described herein may be practiced using various combinations of these elements.

In any case, the device 100 includes, in one embodiment, a detector 110 and a controller 120. As noted, the controller 120 may be separate from the detector 110 in one or more arrangements. For example, the detector 110 may be communicatively coupled but apart from the controller 120 in the form of a handheld device that is cabled to the controller 120 or in wireless communication therewith. As shown in greater detail in FIG. 2, the detector 110 includes four coils that are labeled 2-5. It should be appreciated that while four coils are shown, in further embodiments, the number of coils may vary. For example, the detector 110 may include 3, 5, 6, or another number of coils. In still a further approach, the detector 110 may include separate sets of coils (e.g., sets of four coils) that are tuned for different frequencies). In one implementation, the sets of coils include coils tuned to 10 MHz, 12 MHz, and 14 MHz. The coils may be tuned by changing the length of the coils to obtain resonance at the different frequencies. Of course, depending on the particular implementation, the frequencies and number of sets may vary.

Figure 2:
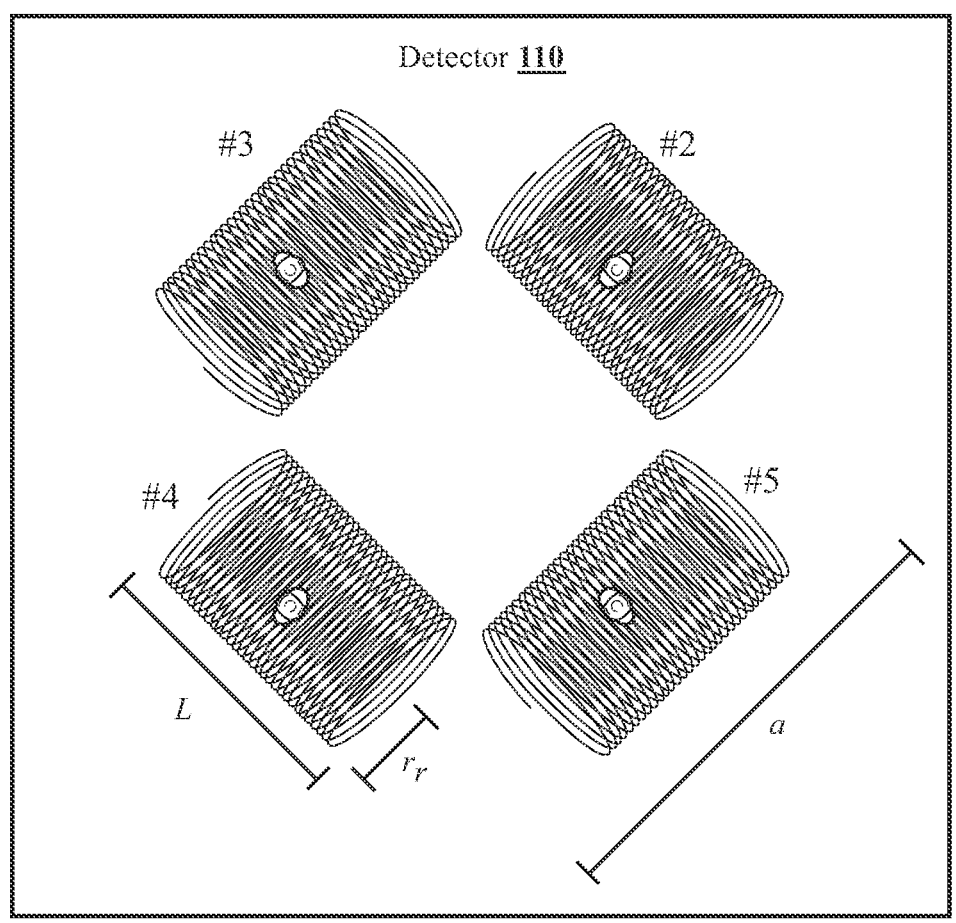
FIG. 2 is a block diagram illustrating one embodiment of a detector.

The coils of the detector may also take different forms depending on the particular implementation. In FIG. 2, the coils 2-5 are shown as cylindrical but may also be implemented in other forms. For example, the coils 2-5 may be rectangular, square, or another suitable shape. As an additional aspect, the coils 2-5 may be printed on a substrate, such as a silicon-based substrate. Moreover, the size of the coils 2-5 can also vary. The coils 2-5, as shown, have dimensions of $r_r=5$ cm, L=15 cm, $n_r=46$, a=27 cm, where a represents a distance between opposing coils. Moreover, in one approach, the coils are arranged in a symmetric manner such that distances between opposing coils are consistent through the arrangement of coils. In FIG. 2, the coils are generally arranged in a square configuration. Depending on the number of included coils, the arrangement generally follows an appropriately sided geometric figure with the coils being positioned along respective sides. Under test a coil 1, as shown in FIG. 3, is used to generate noise and generally has dimensions of $r_t=20$ cm, L=15 cm, $n_t=8.42$.

The construction of individual coils is generally an insulated wire formed of a metal, such as copper, aluminum, etc. The diameter of the wire that forms the coils may also vary but is 0.5 mm in the configuration of FIG. 2. In general, the diameter of the wire is selected according to the desired frequency that is being monitored. Additionally, the separate coils are formed of windings of the wire where the windings are formed about a cylindrical shape having a radius r and a length L. Thus, the number of windings may be dependent on the length and radius, and, in one approach, how many layers of windings are included. In general, the coil includes a single layer of wire windings. As such, each of the coils 2-5 have the same physical properties in relation to shape, size, and physical composition of the wire that forms the coil. Additionally, the direction of the windings on pairs of coils, such as 2/4 and 3/5 is in an opposing manner. That is, the windings are in opposite directions around a form of the coil. Accordingly, as one example, the coils may be wound clockwise on coil 2 and would counter-clockwise on coil 4. In yet a further approach, the pairs may be defined as 2/3 and 4/5 in which case 2 and 4 would be clockwise while 3 and 5 would be counter-clockwise.

The controller 120 may be connected with separate ones of the coils using electrical leads across the respective coils. Thus, the controller 120 can sense a voltage across each separate coil that is induced by the electromagnetic noise. The controller 120 may employ various types of circuits to sense the voltage, such as sense amps, operational amplifiers, logic circuits, and so on. Whichever form is implemented with the controller 120 to sense the voltage, the controller 120 receives the voltages from the coils over electrical leads and, upon sensing values of the voltages, determines the voltage ratios. The voltage ratios are ratios between voltages of the separate coils. In one approach, the controller 120 uses a voltage value from coil 2 to normalize voltage values of coils 3-5 when producing the voltage ratios. For example, the controller 120, in one arrangement, generates the voltage ratios by dividing the voltages from coils 3-5 by the voltage from coil 2.

Figure 3:
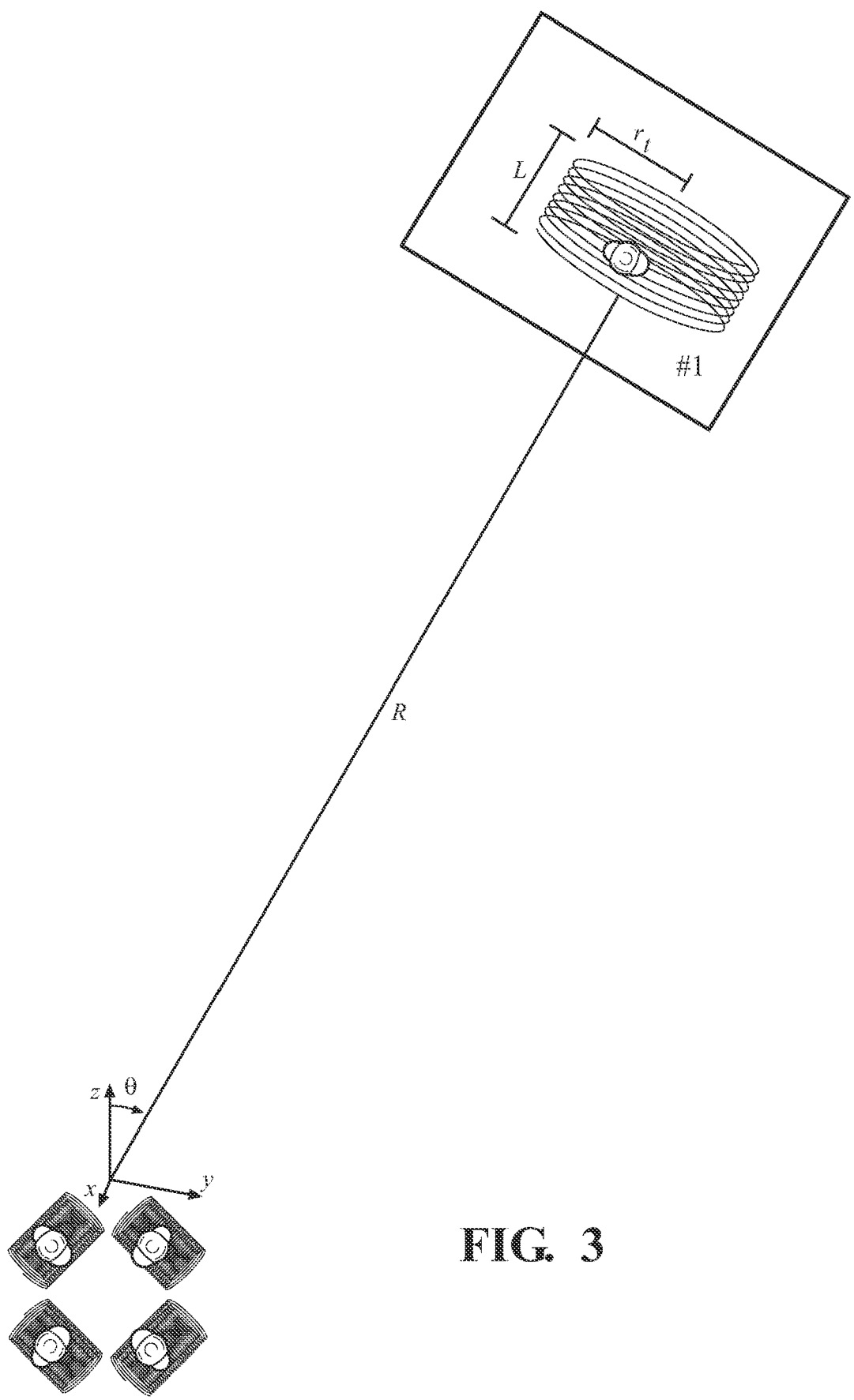
FIG. 3 is a diagram illustrating one embodiment of coils of a detector in relation to a representative noise source.

With reference to FIG. 3, it should be noted that, as used herein, coil 1 is simply a reference to a source of the electromagnetic noise. That is, coil 1 is used in the nomenclature to represent a source of the electromagnetic noise and is not intended to be construed as an actual additional coil within the device 100. FIG. 3 illustrates a relationship between the electromagnetic noise emanated from coil 1 and coils 2-5 of the detector 110. As shown, the coil 1 is a distance R from the detector 110 and is in a direction θ from the detector 110, where θ is illustrated as an angle of displacement from the z-axis.

Figure 4A:
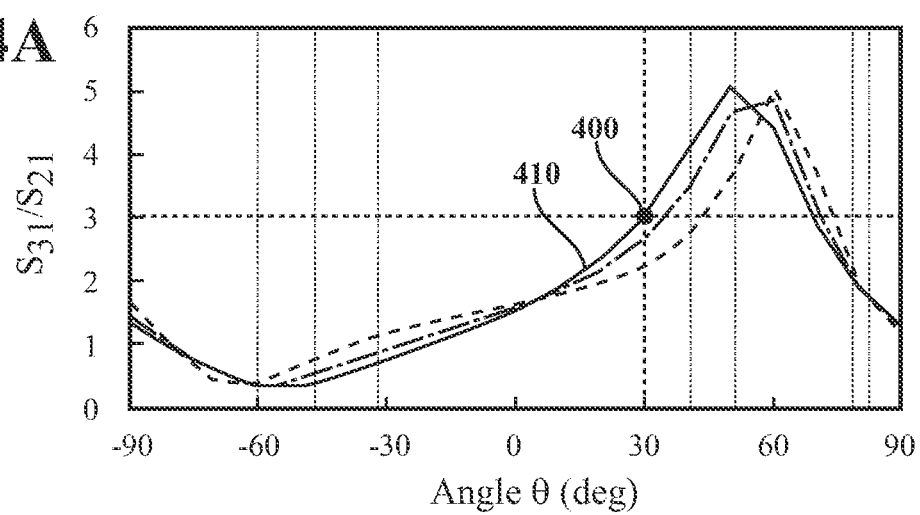
FIG. 4A-C are graphs illustrating the correspondence between the voltage ratios and the direction/distance of a noise source.
Figure 4B:
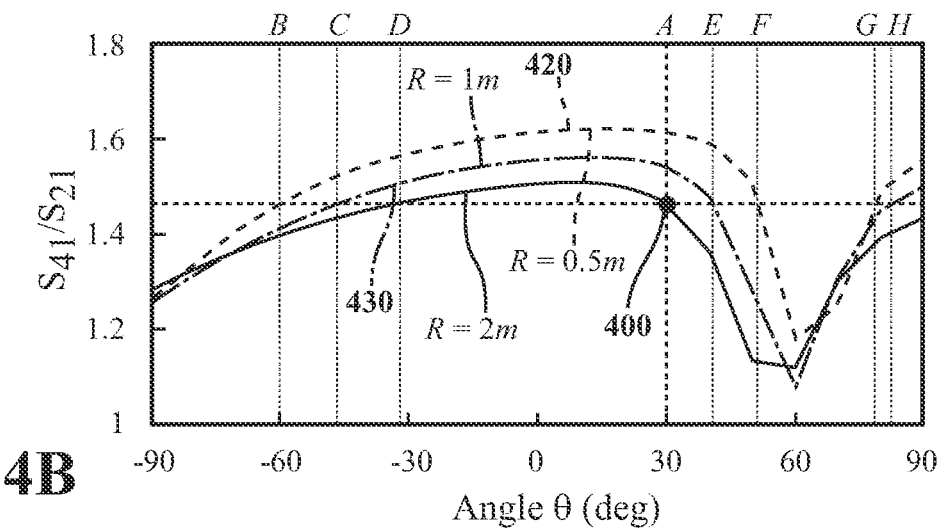
Figure 4C:
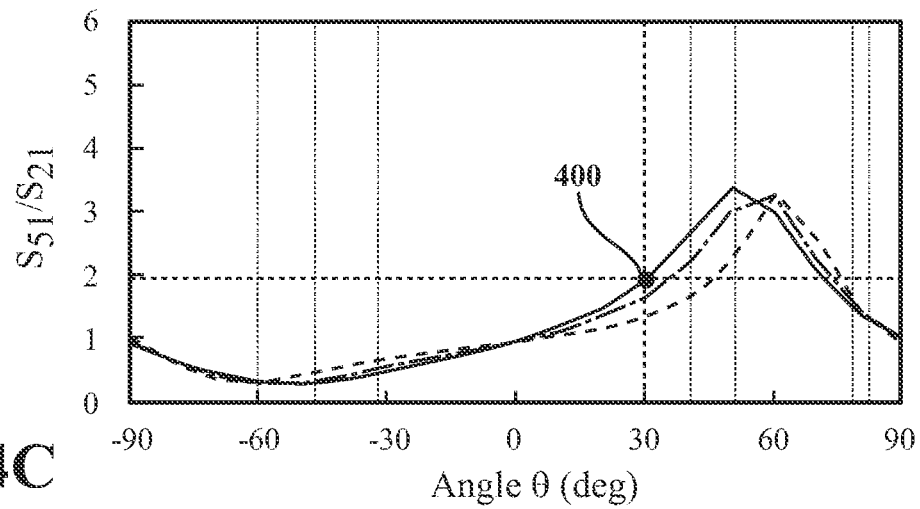
Figure 5:
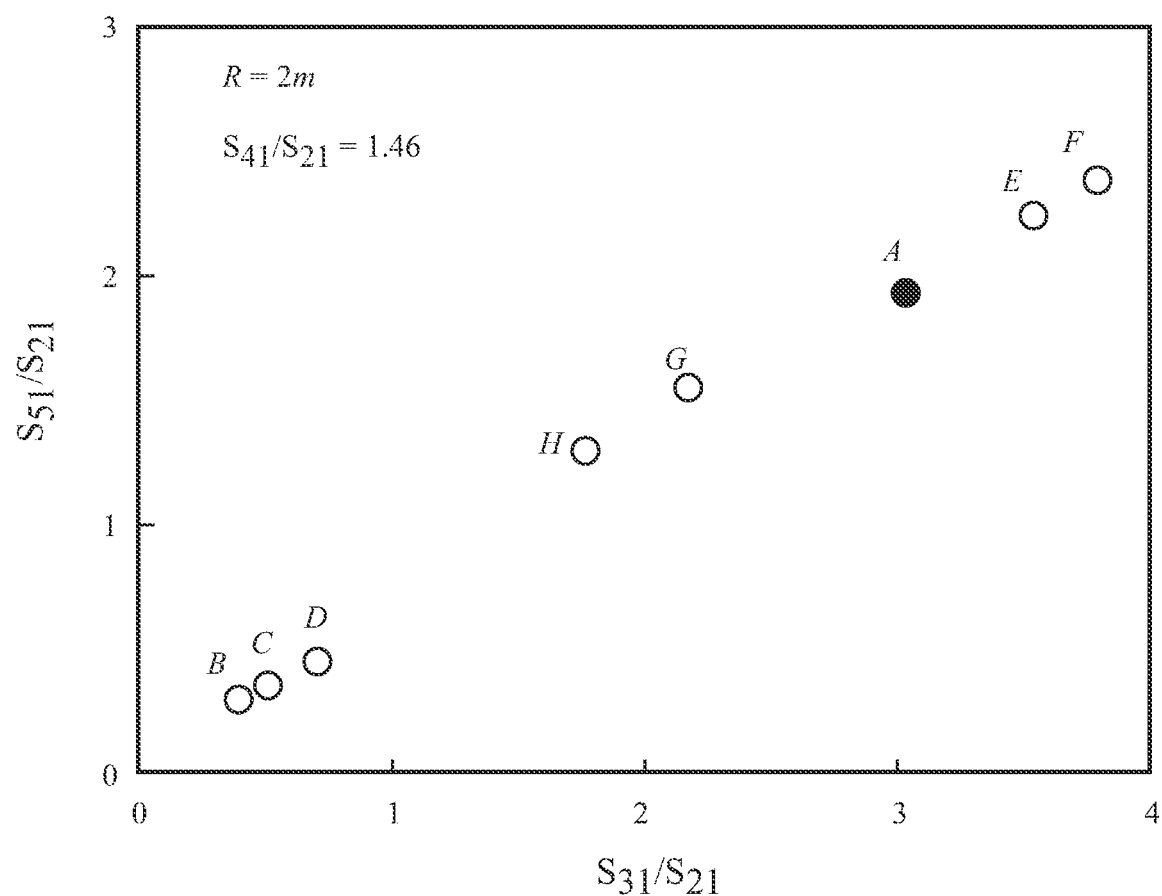
FIG. 5 illustrates a graph of voltage ratios.

With further consideration of FIGS. 4A-C, separate examples of the voltage ratios are shown. As shown in FIGS. 4A-C, point 400 corresponds with observed voltage ratios and an angle of 30 degrees at a distance of 2 m. The voltage ratio across different angles of displacement at a distance of R=2 m is illustrated in line 410. Accordingly, the separate distances are shown as the graphed lines across the angles. Line 410 corresponds with 2 m, line 420 corresponds with 0.5 m, and line 430 corresponds with 1 m. Accordingly, it can be seen how graphs of FIG. 4A-C form the basis of the noted lookup tables to provide a reference to directions of noise at a defined frequency. That is, the controller 120 can reference the voltage ratios in relation to the graphs in order to derive the position in both the direction and distance. Moreover, FIG. 5 illustrates a chart of the ratios between coils 5 and 3 when coil 4 is held constant at 1.46, indicating the relationship between these points.

Figure 6:
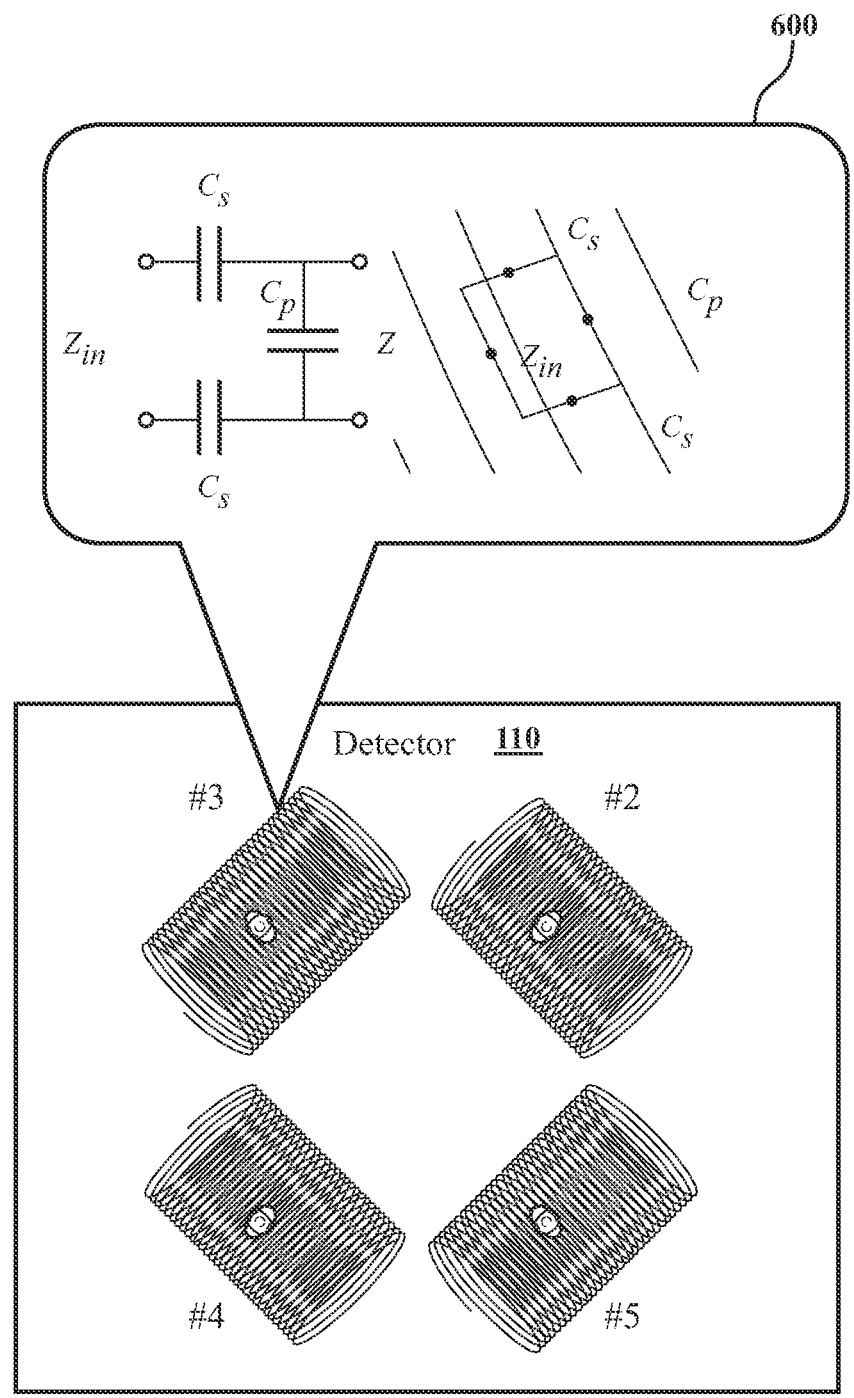
FIG. 6 illustrates a tuning circuit of a coil in the detector.

With reference to FIG. 6, a further embodiment of the detector 110 is illustrated. In FIG. 6, the coils 2-5 separately include a tuning circuit 600 that is connected with the controller 120. As shown, the tuning circuit 600 includes multiple variable capacitors. The controller 120 can control the variable capacitors to tune a frequency that is sensed by the coils 2-5. As one example of how the controller 120 may adjust the capacitors to tune the coils in the detector 110, the controller may adapt the capacitors to have values of $C_s=100$ pF, $C_p=65.2$ pF that provide for shifting the frequency detected by the coils 2-5 by a defined amount. For example, the controller 120 may adapt the values of the variable capacitors to adjust the sensed frequency by +/−20%. As will be discussed in greater detail subsequently, the controller may determine the amount by which to adjust the frequency according to defined steps for scanning, a user input, and so on.

Figure 7A:
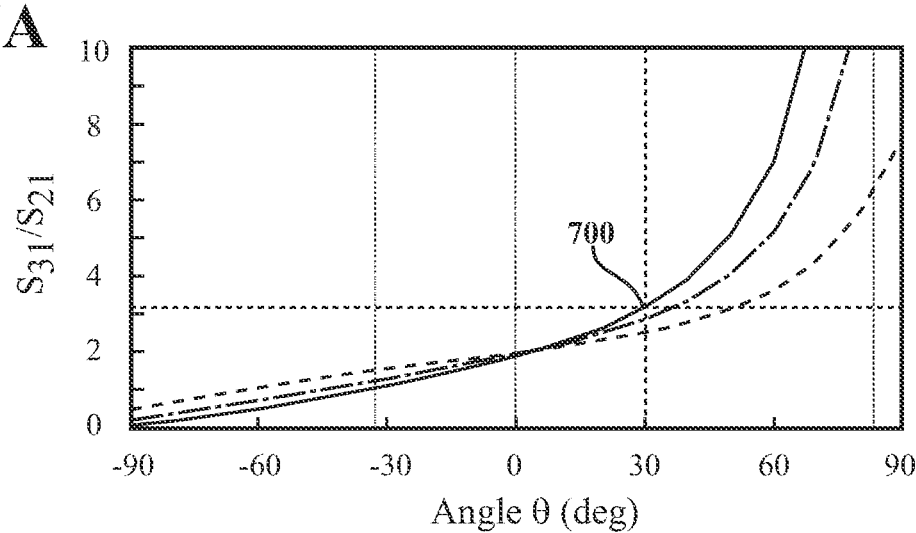
FIG. 7A-C are graphs illustrating the correspondence of voltage ratios with direction and distance for tuned coils.
Figure 7B:
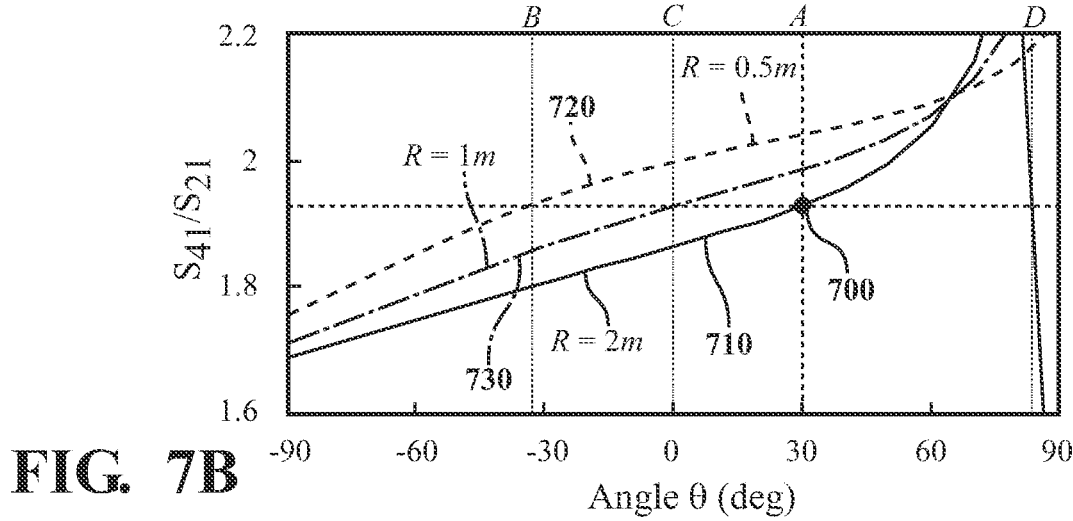
Figure 7C:
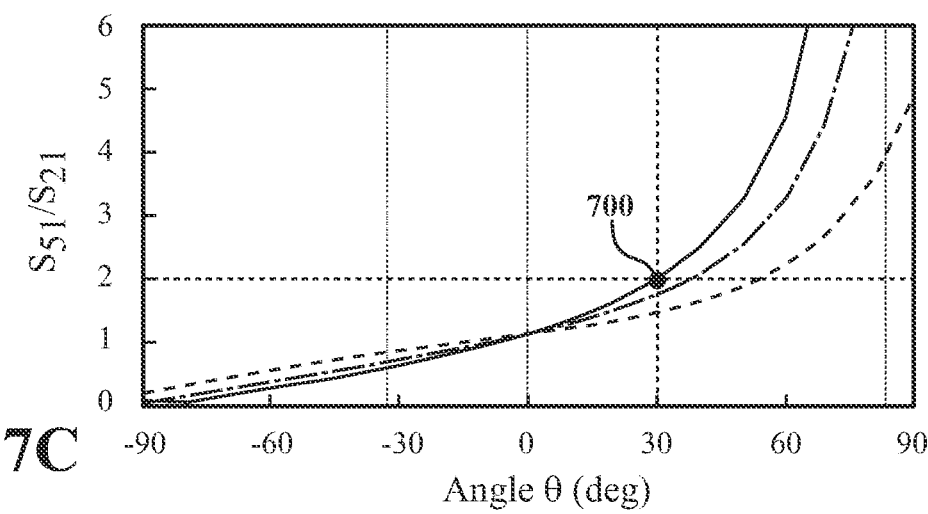
Figure 8:
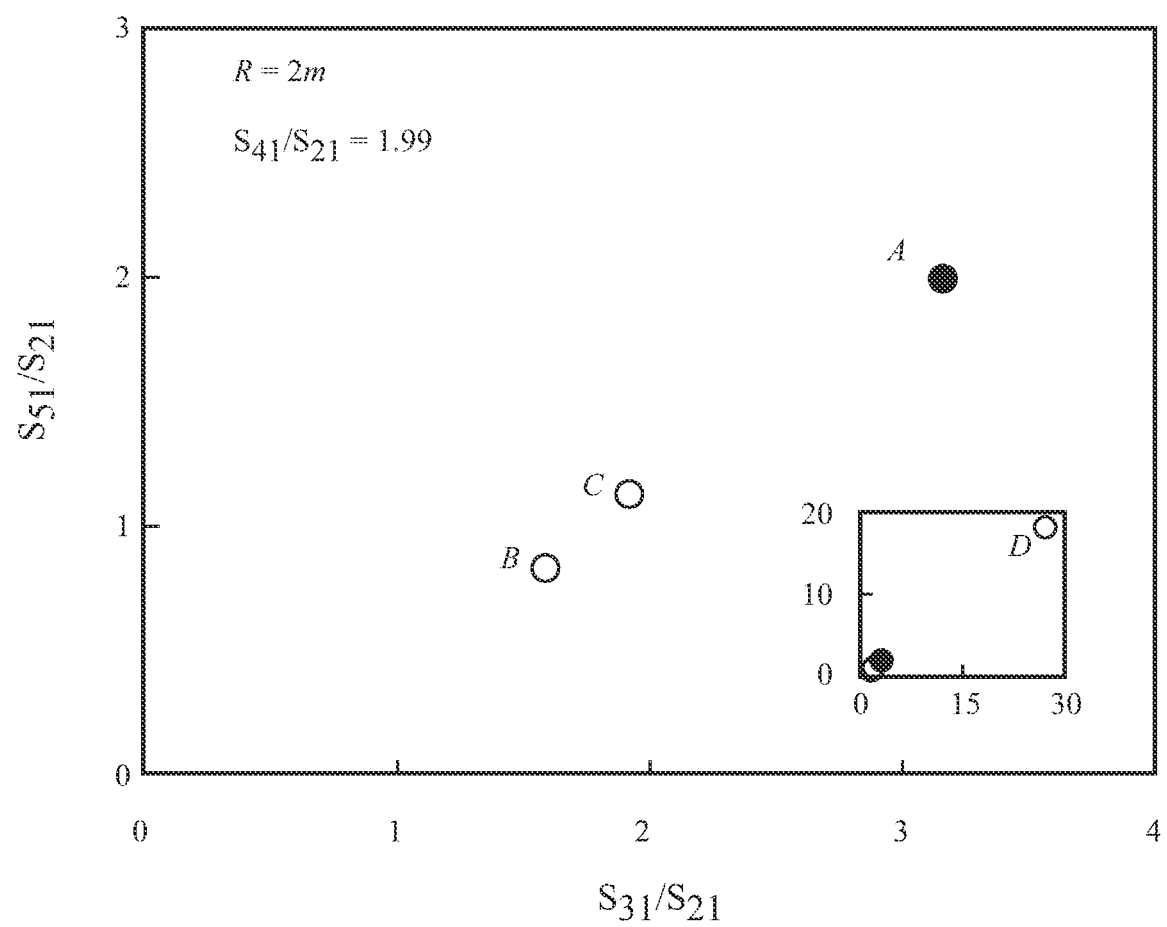
FIG. 8 illustrates a graph of voltage ratios.

With further consideration of FIGS. 7A-C, separate examples of the voltage ratios are shown for a different frequency after the coils 2-5 have been tuned. As shown in FIGS. 7A-C, point 700 corresponds with observed voltage ratios and an angle of 30 degrees at a distance of 2 m. The voltage ratio across different angles of displacement at a distance of R=2 m is illustrated in line 710. Accordingly, the separate distances are shown as the graphed lines across the angles in each graph A-C. Line 710 corresponds with 2 m, line 720 corresponds with 0.5 m, and line 730 corresponds with 1.0 m. Accordingly, it can be seen how graphs of FIG. 7A-C form the basis of the noted lookup tables to provide a reference to directions of noise at a defined frequency for the various distances. That is, the controller 120 can reference the voltage ratios in relation to the graphs in order to derive the position in both the direction and distance. Moreover, FIG. 8 illustrates a chart of the ratios between coils 5 and 3 when coil 4 is held constant at 1.99, indicating the relationship between these points.

Figure 9:
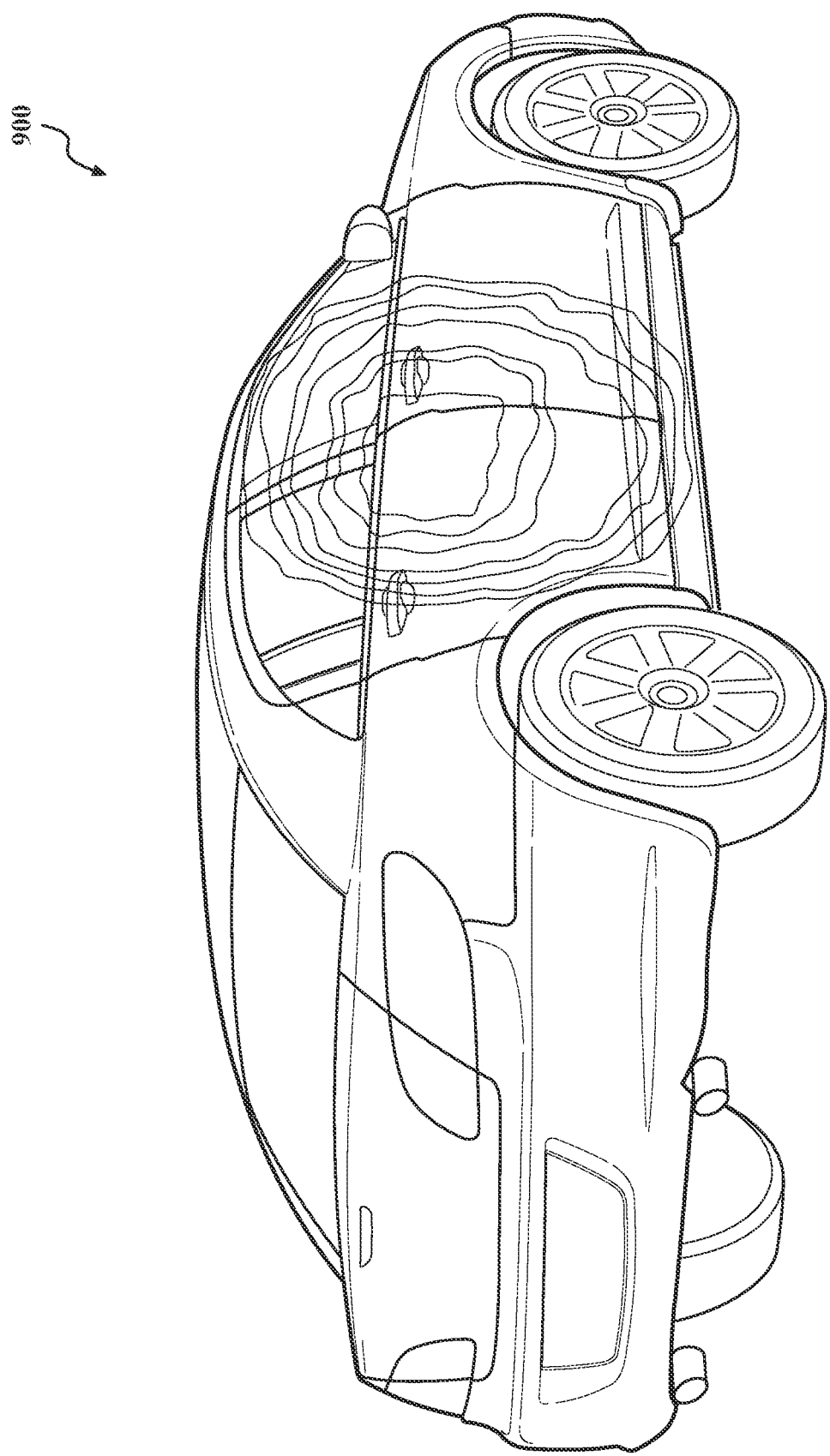
FIG. 9 illustrates one example of a heat map as an overlay on a display of a surrounding environment.

FIG. 9 illustrates an example display 900 that the device 100 may produce on an electronic display. For example, as the device 100 determines the position of the electromagnetic noise, the controller 120 may generate the angle and the distance that are relative to the detector 110 and thus can be overlaid on an image/video of the corresponding region in the surrounding environment. The device 100 may overlay the position as a heatmap to indicate a likelihood of the position. Thus, while the controller 120 may provide a precise indication of angle and distance, the device 100 may translate the angle and distance into coordinates and a probability specifying the likelihood of the noise within a region surrounding the coordinates. In one configuration, the device 100 uses the determined position as an input to an algorithm that produces the heat map according to learned correlations, which further indicates the probabilities associated with separate regions of the heatmap.

To display the image/video with the heatmap, the device 100 may further include an electronic display, such as an LED display screen. In further configurations, the device 100 may electronically communicate the image and overlay to a remote display device via a wired or wireless communication connection. In any case, the device 100 is capable of indicating the position via the noted visuals. Of course, in further aspects, the device 100 may implement alternative means for providing the position (i.e., distance and direction) of the electromagnetic noise. For example, the device 100 may include a speaker that provides audible indicators when the device 100 is moved into closer proximity of the noise, a display for numerically specifying the determined distance/direction, and so on.

Figure 10:
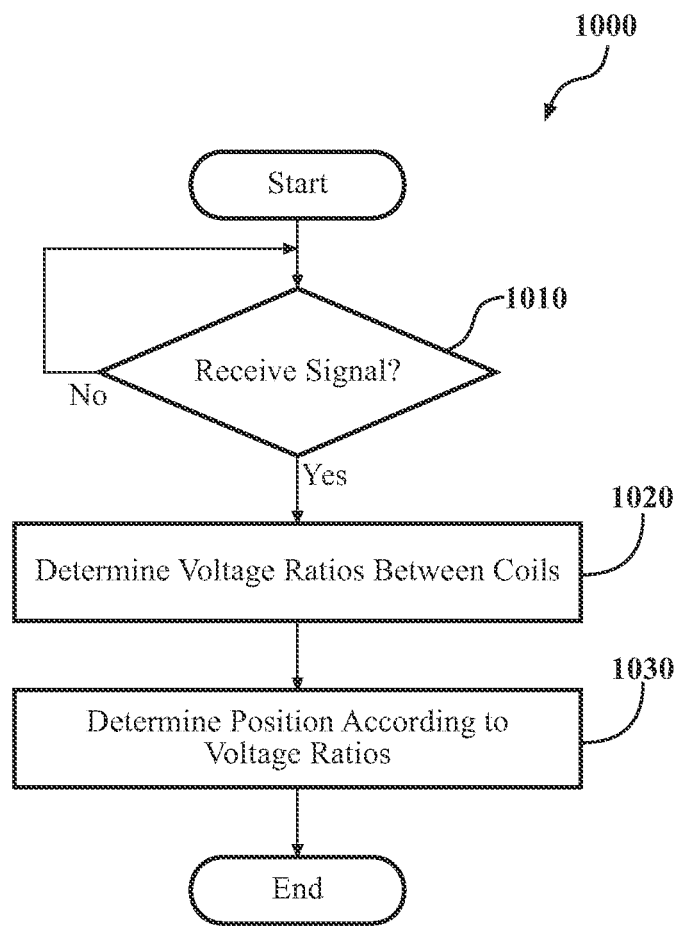
FIG. 10 is a flowchart illustrating one embodiment of a method associated with determining a position of electromagnetic noise using a detector that includes multiple coils.

As a further explanation of determining the position of electromagnetic noise using the device 100, consider method 1000 of FIG. 10. Method 1000 will generally be discussed from the perspective of the device 100 of FIG. 1. At 1010, the device 100 determines whether the detector 110 has received a signal that is electromagnetic noise. In one approach, the controller 120 monitors voltages from the detector 110 to determine if a signal has been encountered. For example, the controller 120 may monitor for a threshold voltage on one or more of the coils 2-5. Thus, when the controller 120 detects the threshold voltage, the controller 120 may proceed to identify a location of the noise. Otherwise, the controller 120 continues to monitor for the noise. It should be noted that the detector 110 is configured to detect the electromagnetic noise at a defined frequency (e.g., 10 MHz) that is generally based on physical characteristics of the coils. In further arrangements, the defined frequency may be adjusted according to the previously noted tuning circuit or through selection of another set of coils. In any case, as described at 1010, it should be understood that the controller 120 is using the detector 110 to monitor a single defined frequency.

At 1020, the controller 120 determines voltage ratios between the coils. For example, the controller 120 senses the voltages from the coils individually and then derives the voltage ratios by dividing the voltages by a voltage of another coil. As discussed previously, the controller 120 may use the voltage value of coil 2 as a divisor for the remaining coils 3-5, which provides for normalizing the voltages. In instances where the number of coils varies from four to another number, e.g., 3, 5, 6, etc., the controller 120 similarly divides the separate voltages from the various coils by a voltage of a first coil to normalize the values and provides the divided values as the ratios. In any case, the controller determines the ratios in order to subsequently provide for determining the position.

At 1030, the controller 120 determines a position of the electromagnetic noise relative to the coils and according to the voltage ratios as defined by a lookup table of positions corresponding with different ratios. That is, the controller 120 uses the voltage ratios as an input to a lookup table that includes sets of voltage ratios for different frequencies of noise. Thus, the controller 120 uses the voltage ratios to determine the direction/angle and the distance of the noise from the detector 110. In various circumstances, the lookup table may specify multiple angles or distances for a certain combination of voltage ratios, as shown in relation to the graphs of FIGS. 4A-C and 7A-C. In these circumstances, the controller 120 may provide all corresponding potential positions and/or may indicate a probability associated with each separate position. When displayed on an image, the particular position of the noise may be apparent due to a plain correlation with an electronic component versus none for other options. In any case, the position specifies where the electromagnetic noise is originating relative to the detector 110 in order to provide for improving identification of an associated source.

Figure 11:
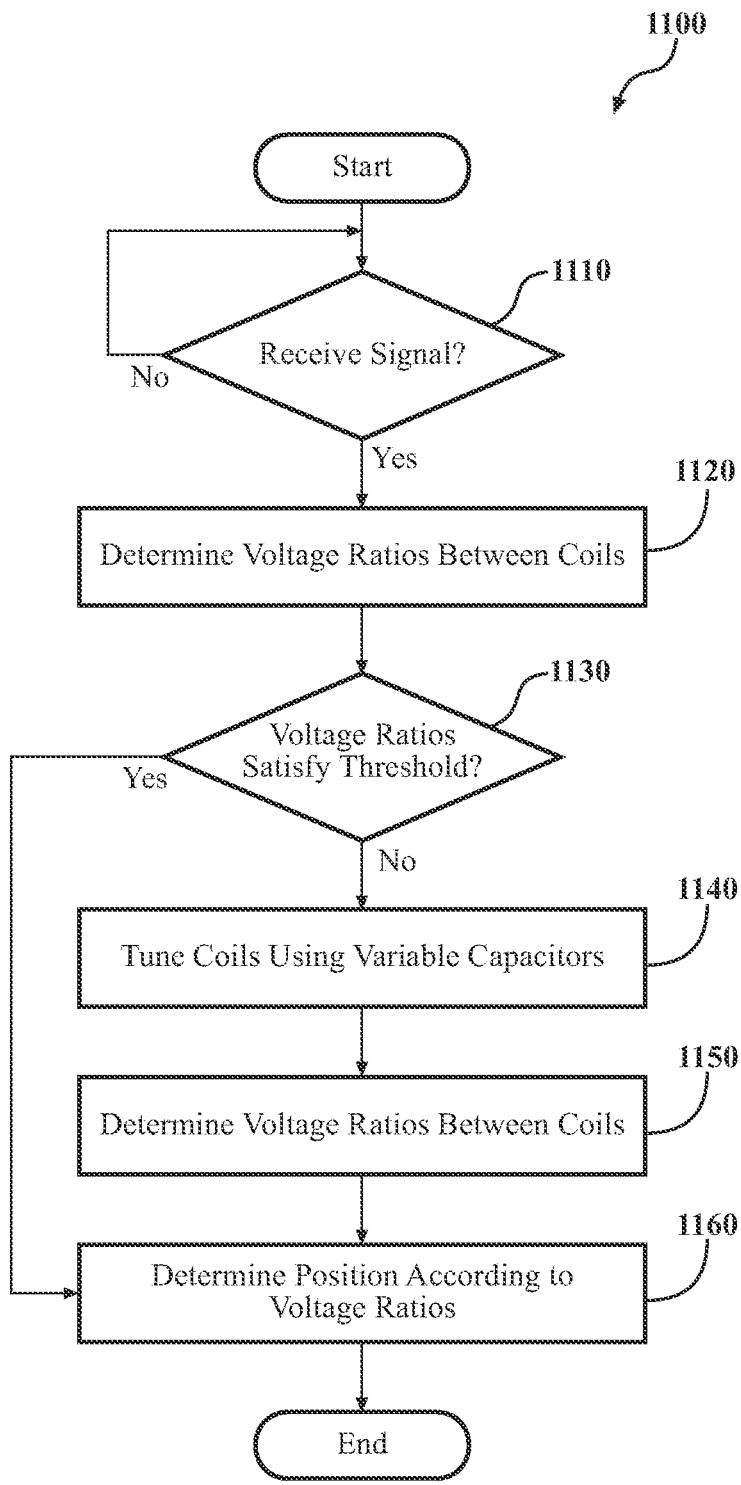
FIG. 11 is a flowchart illustrating one embodiment of a method associated with tuning coils in a detector to detect electromagnetic noise.

Further aspects of determining the position of a source of electromagnetic noise will be described in relation to FIG. 11, which illustrates a flowchart of Method 1100. Method 1100 will generally be discussed from the perspective of the device 100 of FIG. 1.

At 1110, the controller 120 monitors voltages from the detector 110 to determine if a signal has been encountered. For example, the controller 120 may monitor for a threshold voltage on one or more of the coils 2-5. When no voltage is detected at block 1110, the controller 120 may repeatedly monitor for a signal. However, in one arrangement, the controller 120 may stop monitoring after a defined number of iterations or amount of time and proceed to block 1140 where the coils are tuned, or a different set of coils are selected. Once a signal is detected, the controller 120 proceeds to determine voltage ratios at block 1120.

At 1120, the controller 120 determines voltage ratios between the coils. For example, the controller 120 senses the voltages from the coils individually and then derives the voltage ratios by dividing the voltages by a voltage of another coil. As discussed previously, the controller 120 may use the voltage value of coil 2 as a divisor for the remaining coils 3-5, which provides for normalizing the voltages. In instances where the number of coils vary from four to another number, e.g., 3, 5, 6, etc., the controller 120 similarly divides the separate voltages from the various coils by a voltage of a first coil to normalize the values and provides the divided values as the ratios. In any case, the controller determines the ratios in order to subsequently provide for determining the position.

At 1130, the controller 120 determines whether the voltage ratios satisfy a threshold. The threshold indicates, in one arrangement, values for the ratios that are within expected bounds, such as values that are applicable within the lookup table. Thus, if the controller 120 senses voltages that are, for example, very low, then the resulting ratios will not conform with expected values. Accordingly, this instance may indicate that a signal is too weak or not present, and the signal is instead spurious. Thus, the device 100 may instead monitor a different frequency. Accordingly, when the threshold is satisfied, the controller 120 proceeds to determine the position at 1160. However, when the threshold is not satisfied, the controller 120 proceeds to tune the coils at 1140.

Accordingly, at 1140, the controller 120 tunes the coils of the detector 110 using variable capacitors associated with the separate coils. As discussed in relation to FIG. 6, the separate coils 2-5 include individual tuning circuits that are comprised of variable capacitors. Thus, the controller 120 can adjust the bias voltages of the capacitors to change a frequency that is sensed by the coils 2-5. Depending on the particular implementation, the tuning circuit can generally be implemented to adjust the defined frequency for the coils by a percentage, such as 10-20%.

In yet a further approach, the detector may include multiple sets of coils. That is, one set of coils may include four separate coils. The coils of a given set may be tuned to a first frequency, while the coils of a second set are tuned to a different frequency, and so on. The controller 120 may select between the sets of coils to switch the frequency that is to be monitored. Accordingly, the controller 120 may then receive voltages from the selected set of coils. In any case, the device 100 can, in at least one approach, adjust the defined frequency to scan for the electromagnetic noise across a spectrum of possible frequencies.

At 1150, the controller 120 acquires the voltages from the detector 110 after adjusting the defined frequency and determines the voltage ratios. As previously described, the controller 120 senses the voltages from the detector 110 and divides the voltages by, for example, a voltage value of coil 2 to derive the voltage ratios.

At 1160, the controller 120 determines the position using the voltage ratios and provides the position to indicate a location of the electromagnetic noise. As previously noted, the controller 120 may employ a lookup table to determine the position from the voltage ratios as defined in relation to the values described in the graphs from FIGS. 4 and 7. Thus, the controller 120 may use a different lookup table for each separate defined frequency. In this way, the device 100 is able to use the detector 110 to sense the electromagnetic noise and determine a location thereof and without manual/mechanical manipulation (i.e., moving) of the detector 110 to change an orientation relative to the noise.

FIG. 1 will now be discussed in further detail as an example environment within which the system and methods disclosed herein may operate. The device 100 can include one or more processors. In one or more arrangements, the processor(s) can be a main processor of the device 100. For instance, the processor(s) can be an electronic control unit (ECU) embodying control circuitry. The device 100 can include one or more data stores for storing one or more types of data. The data store can include volatile and/or non-volatile memory. Examples of suitable data stores include RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The data store can be a component of the processor(s), or the data store can be operably connected to the processor(s) for use thereby. The term "operably connected," as used throughout this description, can include direct or indirect connections, including connections without direct physical contact, electrical connections, optical connections, and so on.

The one or more data stores can include sensor data. In this context, "sensor data" refers to information produced by the device 100 from sensing electromagnetic noise. The device 100 can include one or more modules. The modules can be implemented as computer-readable program code that, when executed by a processor, implement one or more of the various processes described herein. One or more of the modules can be a component of the processor(s), or one or more of the modules can be executed on and/or distributed among other processing systems to which the processor(s) is operably connected. The modules can include instructions (e.g., program logic) executable by one or more processor(s). Alternatively, or in addition, one or more data stores may contain such instructions. In one or more arrangements, one or more of the modules described herein can include artificial or computational intelligence elements, e.g., neural network, fuzzy logic, or other machine learning algorithms.

Detailed embodiments are disclosed herein. However, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various embodiments are shown in FIGS. 1-11, but the embodiments are not limited to the illustrated structure or application.

The flowcharts and block diagrams in the figures illustrate the architecture, functionality, and operation of possible implementations of systems, methods, and computer program products according to various embodiments. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The systems, components and/or processes described above can be realized in hardware or a combination of hardware and software and can be realized in a centralized fashion in one processing system or in a distributed fashion where different elements are spread across several interconnected processing systems. Any kind of processing system or another apparatus adapted for carrying out the methods described herein is suited. A typical combination of hardware and software can be a processing system with computer-usable program code that, when being loaded and executed, controls the processing system such that it carries out the methods described herein. The systems, components and/or processes also can be embedded in a computer-readable storage, such as a computer program product or other data programs storage device, readable by a machine, tangibly embodying a program of instructions executable by the machine to perform methods and processes described herein. These elements also can be embedded in an application product which comprises all the features enabling the implementation of the methods described herein and, which when loaded in a processing system, is able to carry out these methods.

Furthermore, arrangements described herein may take the form of a computer program product embodied in one or more computer-readable media having computer-readable program code embodied, e.g., stored, thereon. Any combination of one or more computer-readable media may be utilized. The computer-readable medium may be a computer-readable signal medium or a computer-readable storage medium. The phrase "computer-readable storage medium" means a non-transitory storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: a portable computer diskette, a hard disk drive (HDD), a solid-state drive (SSD), a read-only memory (ROM), an erasable programmable read-only memory (EPROM or Flash memory), a portable compact disc read-only memory (CD-ROM), a digital versatile disc (DVD), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

Program code embodied on a computer-readable medium may be transmitted using any appropriate medium, including but not limited to wireless, wireline, optical fiber, cable, RF, etc., or any suitable combination of the foregoing. Computer program code for carrying out operations for aspects of the present arrangements may be written in any combination of one or more programming languages, including an object-oriented programming language such as Java™, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The phrase "at least one of . . . and . . . " as used herein refers to and encompasses any and all possible combinations of one or more of the associated listed items. As an example, the phrase "at least one of A, B, and C" includes A only, B only, C only, or any combination thereof (e.g. AB, AC, BC or ABC).

Aspects herein can be embodied in other forms without departing from the spirit or essential attributes thereof. Accordingly, reference should be made to the following claims, rather than to the foregoing specification, as indicating the scope hereof.

What is claimed is:

1. A device, comprising:
    a detector that includes coils that produce voltages when electromagnetic noise of a defined frequency is present; and
    a controller that senses the voltages and determines a position of the electromagnetic noise relative to the device according to the voltages.

2. The device of claim 1, wherein the coils include four coils.

3. The device of claim 1, wherein the coils are arranged into pairs with members of the pairs having windings formed in opposing directions.

4. The device of claim 3, wherein the opposing directions are clockwise and counter-clockwise.

5. The device of claim 1, wherein the detector includes a tuning circuit that adjusts the coils to sense a different frequency of the electromagnetic noise.

6. The device of claim 5, wherein the tuning circuit includes variable capacitors attached across separate ones of the coils that receive inputs from the controller to adjust the defined frequency.

7. The device of claim 1, wherein the coils having a shape that is one of: a cylinder, a rectangle, and a square.

8. The device of claim 1, wherein the device uses the detector to determine the position without mechanical manipulation of an orientation of the coils.

9. The device of claim 1, wherein the controller determines the position according to a ratio of the voltages as defined by a lookup table.

10. The device of claim 1, wherein the controller generates a heatmap of the position and displays the heatmap on an electronic display as an overlay on an image of a corresponding area.

11. The device of claim 1, wherein the defined frequency is in a range of 10 MHz to 15 MHz.

12. The device of claim 1, wherein the coils include multiple sets that separately sense the electromagnetic noise at different defined frequencies.

13. An apparatus, comprising:
    a detector that includes at least four coils arranged into two pairs, the coils produce voltages when electromagnetic noise of a defined frequency is present, the pairs having windings formed in opposing directions; and
    a controller that senses the voltages and determines a position of the electromagnetic noise relative to the detector according to a ratio of the voltages as defined by a lookup table, the position indicating a distance and direction from the detector.

14. The apparatus of claim 13, wherein the opposing directions are clockwise and counter-clockwise.

15. The apparatus of claim 13, wherein the detector includes a tuning circuit that adjusts the coils to sense a different frequency of the electromagnetic noise, and
    wherein the tuning circuit includes variable capacitors attached across separate ones of the coils that receive inputs from the controller to adjust the defined frequency.

16. The apparatus of claim 13, wherein the coils having a shape that is one of: a cylinder, a rectangle, and a square, and
    wherein the apparatus uses the detector to determine the position without mechanical manipulation of an orientation of the coils including a distance and a direction of the electromagnetic noise.

17. A method, comprising:
    in response to receiving a signal that is electromagnetic noise of a defined frequency, determining voltage ratios between coils in a detector by at least sensing voltages from the coils; and
    determining a position of the electromagnetic noise relative to the coils and according to the voltage ratios as defined by a lookup table of positions corresponding with different ratios.

18. The method of claim 17, wherein in response to determining that the voltage ratios do not satisfy a threshold for detection of the electromagnetic noise, tuning the coils using variable capacitors associated with the coils separately.

19. The method of claim 18, further comprising:
    determining the voltage ratios after tuning the coils to derive the voltage ratios for the electromagnetic noise at a different frequency according to the tuning.

20. The method of claim 17, providing the position to indicate a location of the electromagnetic noise.

* * * * *